United States Patent
Lee et al.

(10) Patent No.: US 12,521,772 B2
(45) Date of Patent: Jan. 13, 2026

(54) SUBSTRATE TREATMENT APPARATUS HAVING HEATING PART

(71) Applicant: DEVICE CO., LTD., Chungcheongnam-do (KR)

(72) Inventors: Taek Youb Lee, Cheonan-si (KR); Hee Won Lee, Cheonan-si (KR)

(73) Assignee: DEVICE CO., LTD., Chungcheongnam-do (KR)

( * ) Notice: Subject to any disclaimer, the term of this patent is extended or adjusted under 35 U.S.C. 154(b) by 120 days.

(21) Appl. No.: 18/424,272

(22) Filed: Jan. 26, 2024

(65) Prior Publication Data

US 2025/0091099 A1  Mar. 20, 2025

(30) Foreign Application Priority Data

Sep. 15, 2023 (KR) .................. 10-2023-0123263

(51) Int. Cl.
*B08B 3/10* (2006.01)
*B05C 13/00* (2006.01)
*H05B 3/00* (2006.01)

(52) U.S. Cl.
CPC ............... *B08B 3/10* (2013.01); *B05C 13/00* (2013.01); *H05B 3/0047* (2013.01)

(58) Field of Classification Search
CPC .......... B05C 13/00; B08B 3/10; H05B 3/0047
See application file for complete search history.

(56) References Cited

U.S. PATENT DOCUMENTS

| | | | |
|---|---|---|---|
| 11,043,403 B2 * | 6/2021 | Kim | H01L 21/68728 |
| 2002/0051644 A1 * | 5/2002 | Sugimoto | H01L 21/67028 396/564 |
| 2014/0090669 A1 * | 4/2014 | Hinode | H01L 21/30604 134/105 |
| 2014/0231013 A1 * | 8/2014 | Hinode | H01L 21/67051 156/345.23 |
| 2014/0339215 A1 * | 11/2014 | Plazonic | H01L 21/68792 219/443.1 |
| 2015/0034133 A1 * | 2/2015 | Kim | H01L 21/67051 134/105 |
| 2016/0013079 A1 * | 1/2016 | Choi | H01L 21/67051 156/345.21 |
| 2017/0043379 A1 * | 2/2017 | Sasaki | H01L 21/6708 |
| 2017/0256433 A1 * | 9/2017 | Hammer | H01L 21/67051 |
| 2018/0002811 A1 * | 1/2018 | Motomatsu | C23C 18/163 |
| 2018/0047596 A1 * | 2/2018 | Si | H01L 21/67034 |
| 2019/0198363 A1 | 6/2019 | Shimai et al. | |
| 2019/0311923 A1 * | 10/2019 | Kim | H01L 21/6708 |
| 2019/0318946 A1 * | 10/2019 | Kim | H01L 21/67115 |
| 2020/0075355 A1 * | 3/2020 | Kwon | H01L 21/67115 |

* cited by examiner

Primary Examiner — Benjamin L Osterhout
(74) Attorney, Agent, or Firm — BLANK ROME LLP

(57) ABSTRACT

The present disclosure relates to a substrate treatment apparatus having a heating part, including: a chuck base disposed rotatable around a rotational axis and having a ring-shaped spin chuck with chuck pins to support a substrate and a chuck support part located on lower portion of the inner peripheral surface of the spin chuck; a back nozzle assembly mounted at the center of the chuck base; cover glass disposed between top of the spin chuck and the back nozzle assembly; and a heating part disposed between the cover glass and the chuck support part, wherein slant refracting surface is formed on a central portion of the cover glass and slants upward in a radial direction with respect to the rotational axis.

9 Claims, 8 Drawing Sheets

PRIOR ART

SUBSTRATE TREATMENT APPARATUS HAVING HEATING PART

CROSS REFERENCE TO RELATED APPLICATION OF THE DISCLOSURE

The present application claims the benefit of Korean Patent Application No. 10-2023-0123263 filed in the Korean Intellectual Property Office on Sep. 15, 2023, the entire contents of which are incorporated herein by reference.

BACKGROUND OF THE DISCLOSURE

Field of the Disclosure

The present disclosure relates to a substrate treatment apparatus having a heating part, more specifically to a substrate treatment apparatus having a heating part that is capable of uniformly transferring radiation heat generated from the heating part to the entire surface of a substrate.

Background of the Related Art

Generally, a substrate treatment apparatus is an apparatus that performs, with the use of treatment liquids, various processes such as deposition, photolithography, etching, and cleaning for substrates such as semiconductor wafers, substrates for display, optical disk substrates, magnetic disk substrates, photomask substrates, ceramic substrates, solar cell substrates, and the like.

Among them, the cleaning process is carried out to remove foreign substances or particles from the substrate, and representatively, a treatment liquid is supplied to top or underside of a substrate to perform the cleaning process for the substrate, while the substrate is rotating at a high speed in a state of being supportedly placed on top of a chuck base (spin head).

In this case, a heating part with LEDs is located under the substrate to allow the substrate to be heated to a given temperature, and next, if the heated substrate rotates so that it is subjected to a given treatment, a reaction occurs fast to reduce the amount of a treatment liquid used. Further, the environmental contamination caused by the application of the treatment liquid is minimized, and the time required for the treatment is shortened to achieve improvement of productivity and a reduction in the quantity of electricity consumed.

Various technologies and studies of a substrate treatment apparatus capable of rotating the substrate in a state where the substrate is heated have been proposed and developed.

As shown in FIG. 1, chuck pins 5 are disposed on top of a chuck base 1, and a back nozzle assembly 2 stands up under the center of a substrate W fixed to the chuck pins 5 in such a way as to pass through the chuck base 1 to spray a treatment liquid onto the underside of the substrate W.

Further, cover glass 4 is located between the heating part 3 and the substrate W to prevent the treatment liquid sprayed from the back nozzle assembly 2 from entering the heating part 3, while allowing the radiation heat of the heating part 3 to be smoothly transferred therethrough.

The heating part 3 is located between the inner periphery of the ring-shaped chuck base 1 and the outer periphery of the back nozzle assembly 2, and the cover glass 4 is located on top of the chuck base 1 in such a way as to be spaced apart from the heating part 3.

In this case, the back nozzle assembly 2 is located at a higher position than the heating part 3, and even the chuck base 1 onto which the cover glass 4 is fixed is located at a higher position than the heating part 3, so that the radiation heat generated from the heating part 3 has interference with the back nozzle assembly 2 and the chuck base 1, thereby lowering heat transfer efficiency.

To prevent the heat transfer from interfering with the back nozzle assembly 2 and the chuck base 1, the heating part 3 is somewhat spaced apart from the outer peripheral surface of the back nozzle assembly 2 and the inner peripheral surface of the chuck base 1 by given distances, but in this case, the area itself of the heating part 3 becomes reduced to cause the total amount of heat transferred to decrease.

SUMMARY OF THE DISCLOSURE

Accordingly, the present disclosure has been made in view of the above-mentioned problems occurring in the related art, and it is an object of the present disclosure to provide a substrate treatment apparatus having a heating part that is capable of uniformly transferring radiation heat generated from the heating part to the entire surface of a substrate.

To accomplish the above-mentioned objects, according to the present disclosure, there is provided a substrate treatment apparatus having a heating part, including: a chuck base disposed rotatable around a rotational axis and having a ring-shaped spin chuck with chuck pins disposed on top thereof to support a substrate and a chuck support part located on the lower portion of the inner peripheral surface of the spin chuck; a back nozzle assembly mounted through a hollow portion formed at the center of the chuck base to spray a treatment liquid onto the underside of the substrate; cover glass disposed between top of the spin chuck and the back nozzle assembly, when viewed in plan view, and having a through hole formed at the center thereof to pass the back nozzle assembly therethrough; and the heating part disposed inside the inner peripheral surface of the spin chuck in a space between the cover glass and the chuck support part, wherein when viewed in plan view, the cover glass has a slant refracting surface formed with a given width around the through hole, and when viewed on a front section, the slant refracting surface is slant upward from top of the cover glass in a radial direction with respect to the rotational axis.

According to the present disclosure, desirably, the thickness of the cover glass on the outside of the slant refracting surface along the radial direction is formed to be bigger than the thickness thereof on the inside.

According to the present disclosure, desirably, the vertical lines passing through the innermost portion of the heating part may pass through the slant refracting surface.

According to the present disclosure, desirably, the higher the relative height of the back nozzle assembly to the cover glass may be, the smaller a slant angle of the slant refracting surface may be, and the bigger the diameter of the back nozzle assembly may be, the larger the slant angle of the slant refracting surface may be.

According to the present disclosure, desirably, the slant refracting surface may be slant in the range of 2 to 10 degrees with respect to a horizontal plane.

According to the present disclosure, desirably, the bigger the diameter of the back nozzle assembly may be and the higher the relative height of the back nozzle assembly to the cover glass may be, the larger the width of the slant refracting surface may be.

According to the present disclosure, desirably, a portion of the heating part, which is close to the rotational axis, may be a slant heating portion inclined toward the slant refracting surface.

According to the present disclosure, desirably, the slant heating portion may have a slant angle in the range of 2 to 15 degrees with respect to the horizontal plane.

According to the present disclosure, desirably, the spin chuck may have slant surfaces or slant step portions inclined outward in a radial direction with respect to the vertical line from top of the inner peripheral surface thereof, and when viewed on a front section, the spin chuck may have no interference with a reference line connecting the periphery of the substrate and the outermost position of the heating part.

According to the present disclosure, desirably, the surface connecting the start edge and end edge of each slant surface or slant step portion may be the same as the reference line or slant more outward than the reference line.

According to the present disclosure, desirably, at least a portion of the back nozzle assembly, which is located inside the slant refracting surface, may be made of a transparent or semi-transparent material.

According to the present disclosure, desirably, the back nozzle assembly may include a back nozzle support shaft, a nozzle body supported on the back nozzle support shaft, a nozzle skirt disposed on top of the nozzle body with a cover glass in between, and a back nozzle passing up and down through the back nozzle support shaft, the nozzle body, and the nozzle skirt, and the nozzle skirt, the nozzle body, and the back nozzle may be made of the transparent or semi-transparent material.

According to the present disclosure, desirably, the transparent or semi-transparent material of the back nozzle assembly may be selected from quartz, sapphire, perfluoroalkoxy (PFA), and polychlorotrifluoroethylene (PCTFE).

BRIEF DESCRIPTION OF THE DRAWINGS

The above and other objects, features and advantages of the present disclosure will be apparent from the following detailed description of the embodiments of the disclosure in conjunction with the accompanying drawings, in which.

DETAILED DESCRIPTION OF THE PREFERRED EMBODIMENT

Hereinafter, an embodiment of the present disclosure will be explained in detail with reference to the attached drawings.

Figure 1:
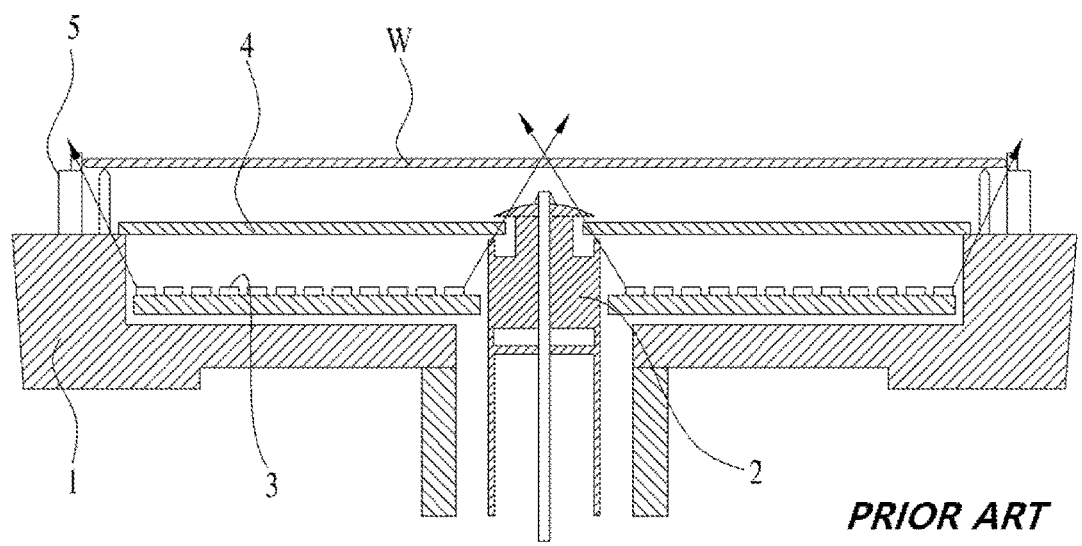
FIG. 1 is a front sectional view showing a conventional substrate treatment apparatus having a heating part.
Figure 2:
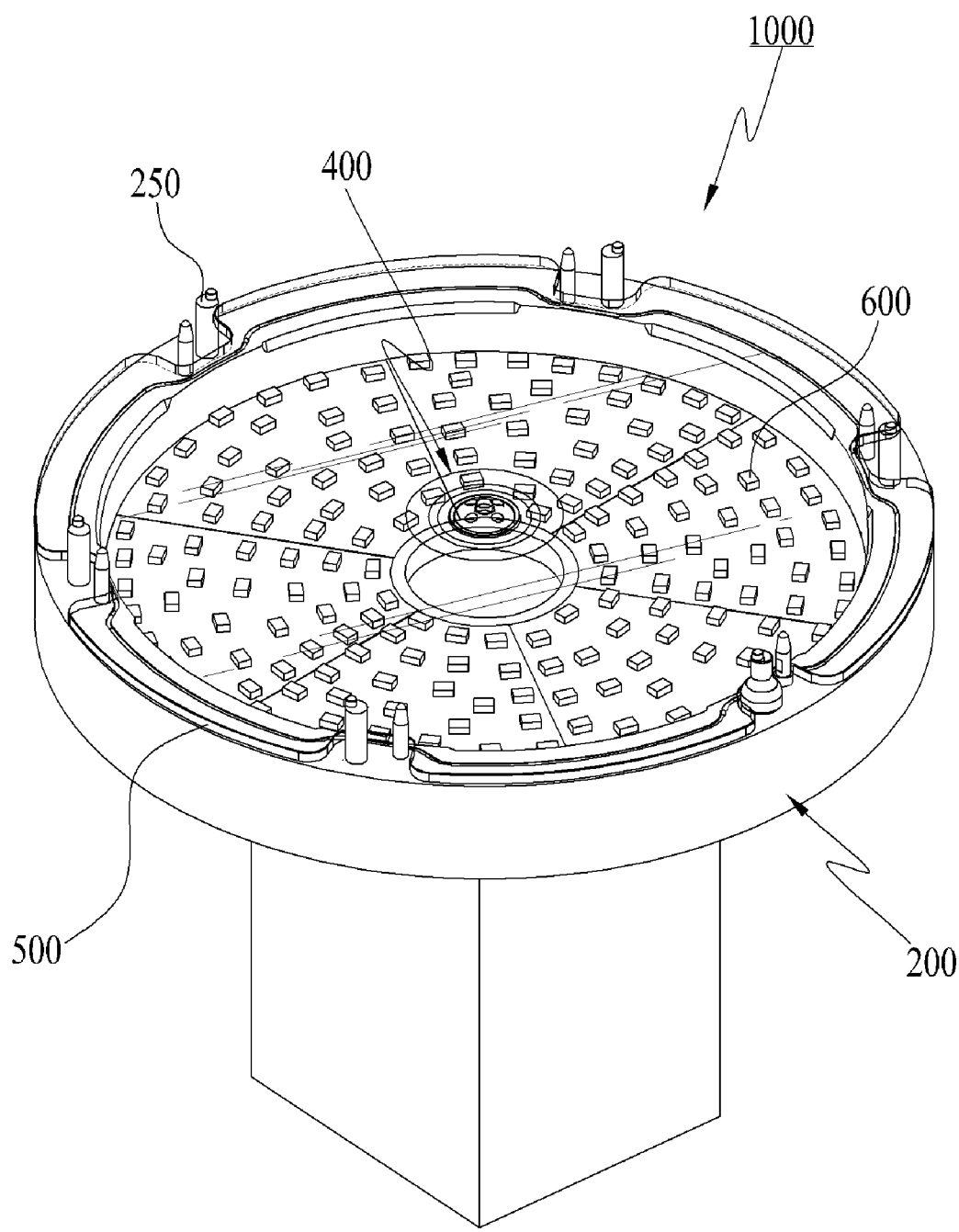
FIG. 2 is a perspective view showing a substrate treatment apparatus having a heating part according to an embodiment of the present disclosure.
Figure 3:
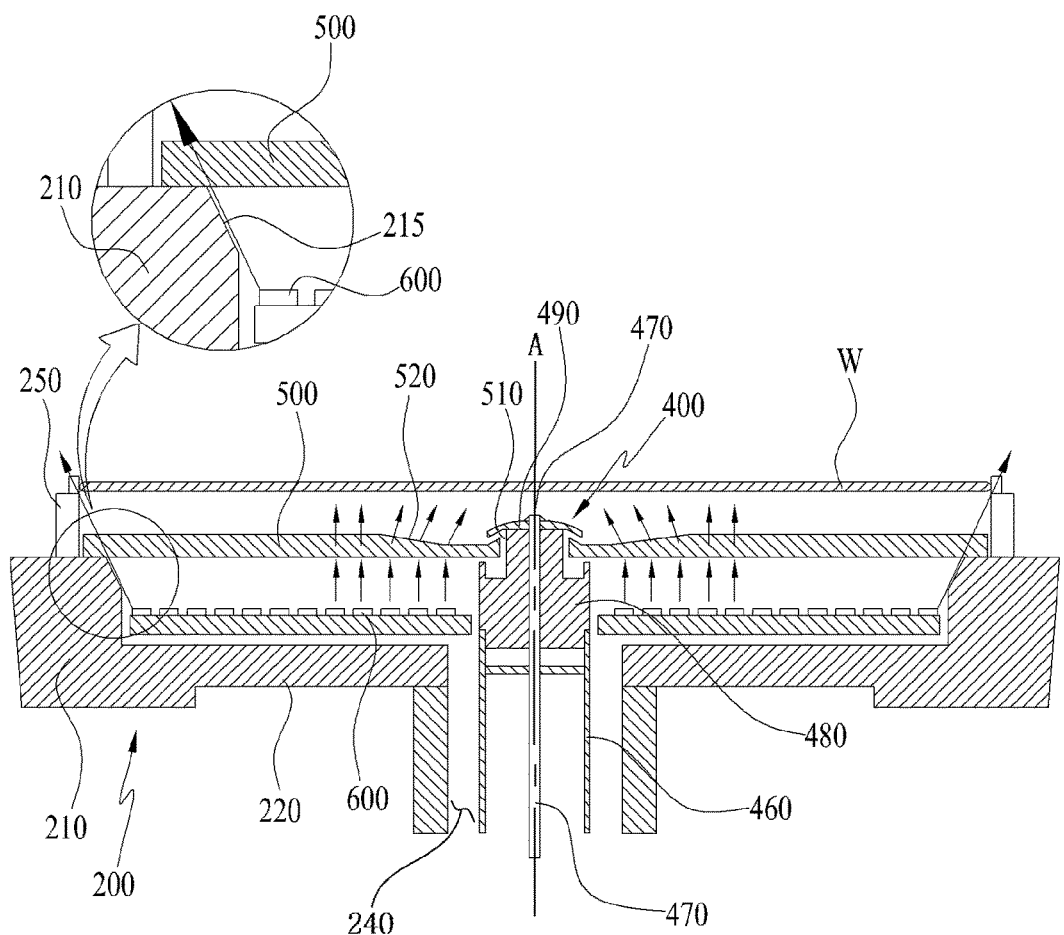
FIG. 3 is a front sectional view showing the substrate treatment apparatus according to the present disclosure.
Figure 4:
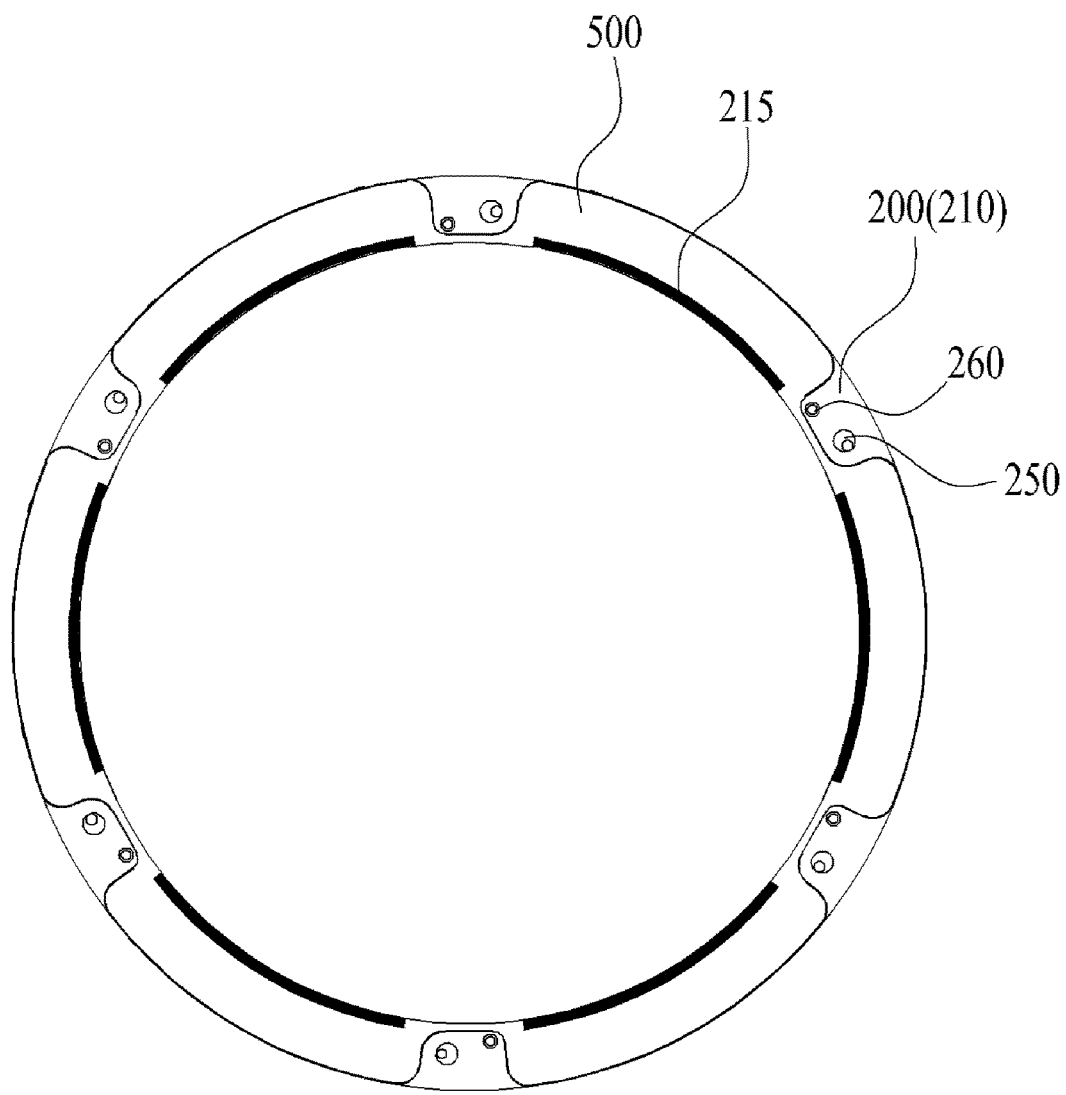
FIG. 4 is a plan view showing the substrate treatment apparatus according to the present disclosure.

As shown in FIGS. 2 to 4, a substrate treatment apparatus 1000 having a heating part according to the present disclosure includes: a chuck base 200 disposed rotatable around a rotational axis and having a ring-shaped spin chuck 210 with chuck pins 250 disposed on top thereof to support a substrate W and a chuck support part 220 located on the lower portion of the inner peripheral surface of the spin chuck 210; a back nozzle assembly 400 mounted through a hollow portion 240 formed at the center of the chuck base 200 to spray a treatment liquid onto the underside of the substrate W; cover glass 500 disposed between top of the spin chuck 210 and the back nozzle assembly 400, when viewed in plan view, and having a through hole 510 formed at the center thereof to pass the back nozzle assembly 400 therethrough; and the heating part 600 disposed inside the inner peripheral surface of the spin chuck 210 in a space between the cover glass 500 and the chuck support part 220, wherein when viewed in plan view, the cover glass 500 has a slant refracting surface 520 formed with a given width around the through hole 510, and when viewed on a front section, the slant refracting surface 520 is slant upward from top of the cover glass 500 in a radial direction with respect to the rotational axis A.

Under such a configuration, light, which is incident onto the cover glass 500 from the heating part 600 having LEDs is refracted on the slant refracting surface 520 and thus irradiated onto the center of the substrate W, without having any interference with the back nozzle assembly 400 located at the center of the chuck base 200, so that the radiation heat generated from the heating part 600 is transferred uniformly to the entire region of the substrate W.

In this case, the thickness of the cover glass 500 on the outside of the slant refracting surface 520 along the radial direction is formed to be bigger than the thickness thereof on the inside, and to do this, the neighboring region around the through hole 510 of the flat cover glass 500 is simply machined to be slant.

Of course, it is possible that the cover glass 500 with the slant refracting surface 520 is molded at one time using a mold.

When viewed on the front section, the slant refracting surface 520 is formed to the shape of a straight line or to the shape of a convex or concave curved line.

Further, the slant refracting surface 520 is formed to be connected directly to the through hole 510, and otherwise, it may be formed with a given gap in a radial direction.

Moreover, if a portion of the inner peripheral surface of the through hole 510 of the cover glass 500 is formed horizontally, the interference with the back nozzle assembly 400 is prevented as much as possible, and further, the insertion of the cover glass 500 into the grooves formed on the outer peripheral surface of the back nozzle assembly 400 is more easily performed.

Further, if the vertical lines passing through the innermost portion of the heating part 600 are designed to pass through the slant refracting surface 520, the light irradiated from the innermost portion heating of the part 600 is appropriately refracted over the back nozzle assembly 400, so that the radiation heat generated from the heating part 600 is transferred to the central portion of the substrate W efficiently.

A width of the slant refracting surface 520 is determined in an appropriate range through tests, especially according to a diameter of the back nozzle assembly 400 and a relative height of the back nozzle assembly 400 to the cover glass 500.

For example, the bigger the diameter of the back nozzle assembly 400 is and the higher the relative height of the back nozzle assembly 400 to the cover glass 500 is, the larger the width of the slant refracting surface 520 is, so that the transferred light becomes closest to the center of the substrate W.

If the width of the slant refracting surface 520 too increases, a refraction proportion toward the rotational axis A becomes larger so that the intermediate portion of the substrate W between the center and the outer periphery thereof is not sufficiently heated, thereby failing to achieve uniform heating. Contrarily, if the width of the slant refracting surface 520 too decreases, the central portion of the substrate W is not sufficiently heated, thereby failing to achieve uniform heating.

Accordingly, it is desirable that the width of the slant refracting surface 520 be determined in the range of 1/20 to 1/10 of the diameter of the heating part 600, but of course, it may be somewhat beyond the range.

Further, it is preferable that the slant refracting surface 520 is slant in the range of 2 to 10 degrees with respect to a horizontal surface, so that the cover glass 500 desirably transfers the radiation heat of the heating part 600 to the central portion of the substrate W, without avoiding the interference with the back nozzle assembly 400.

However, of course, a certain degree of effect is achieved even if the angle of the slant refracting surface 520 with respect to a horizontal surface is somewhat outside the above range.

If the slant refracting surface 520 has the shape of the curved line, the tangent line of the curved line represents an angle with the horizontal plane.

This is differently determined according to a diameter of the back nozzle assembly 400 and a relative height of the back nozzle assembly 400 to the cover glass 500.

For example, the higher the relative height of the back nozzle assembly 400 to the cover glass 500 is, the smaller a slant angle α (See FIG. 5) of the slant refracting surface 520 is, so that the transferred light reaches the center of the substrate W at a gentle angle in a state of having no interference with the back nozzle assembly 400.

Further, the bigger the diameter of the back nozzle assembly 400 is, the larger the slant angle of the slant refracting surface 520 is, so that the transferred light reaches the center of the substrate W at a steep angle.

Furthermore, at least a portion of the back nozzle assembly 400, which is located inside the slant refracting surface 520, is made of a transparent or semi-transparent material, and accordingly, the light transmits the cover glass 500 toward the center of the substrate W, without being blocked by the back nozzle assembly 400, so that the light uniformly heats the entire region of the substrate W.

The transparent or semi-transparent material of the back nozzle assembly 400 is selected from quartz, sapphire, perfluoroalkoxy (PFA), and polychlorotrifluoroethylene (PCTFE).

For example, as shown in FIG. 3, the back nozzle assembly 400 includes a back nozzle support shaft 460, a nozzle body 480 supported on the back nozzle support shaft 460, a nozzle skirt 490 disposed on top of the nozzle body 480 with a cover glass 500 in between, and a back nozzle 470 passing through the back nozzle support shaft 460, the nozzle body 480, and the nozzle skirt 490 up and down, and the nozzle skirt 490, the nozzle body 480, and the back nozzle 470 are made of the above-mentioned transparent or semi-transparent material.

Figure 5:
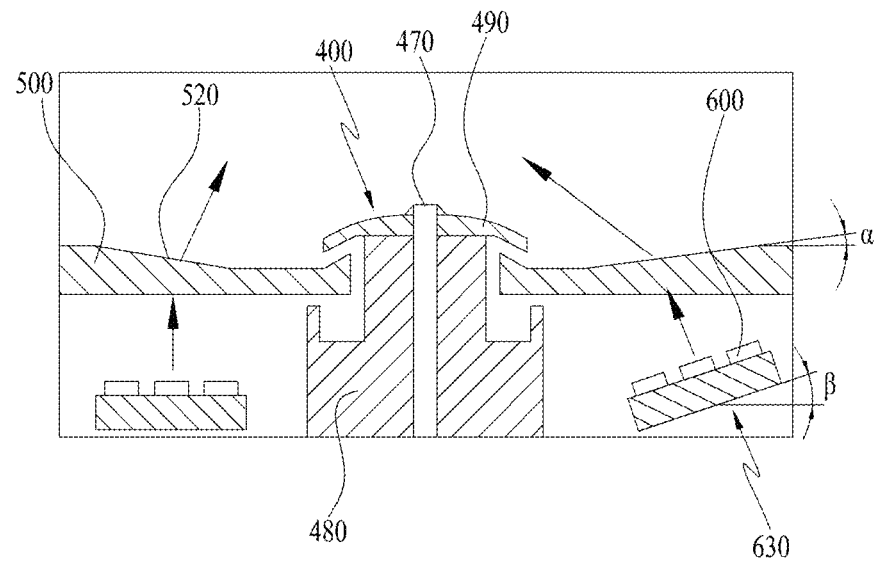
FIG. 5 is a front sectional view showing a substrate treatment apparatus according to another embodiment of the present disclosure.
Figure 6A:
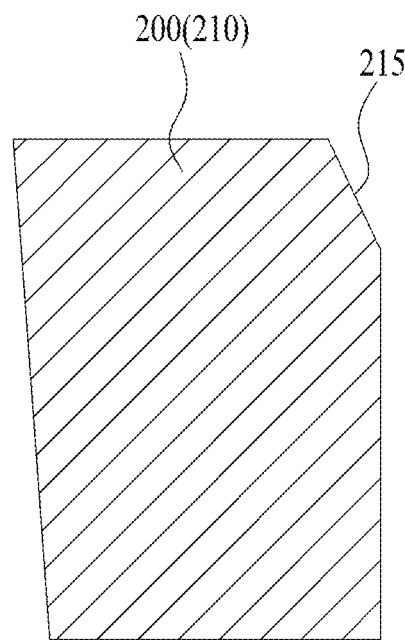
FIG. 6A is cross-sectional view showing an example of a slant surface applicable to FIG. 3.
Figure 6B:
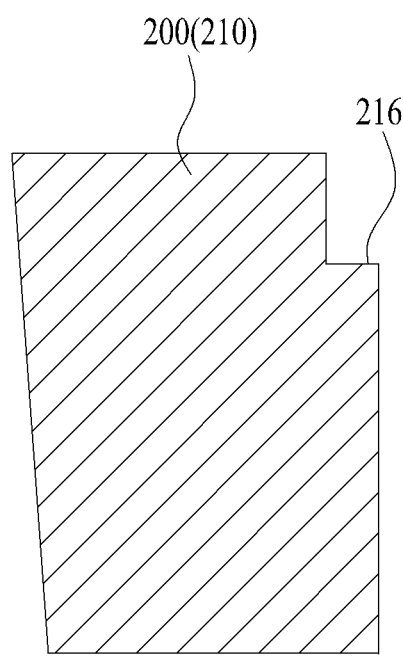
FIG. 6B is cross-sectional view showing an example of a slant step portion applicable to FIG. 3.
Figure 6C:
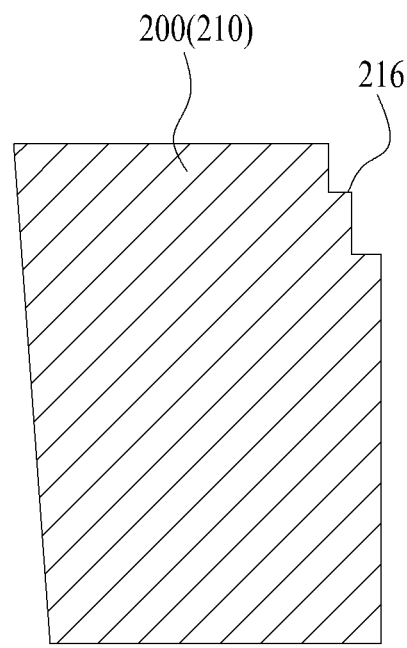
FIG. 6C is cross-sectional view showing another example of a slant step portion applicable to FIG. 3.
Figure 6D:
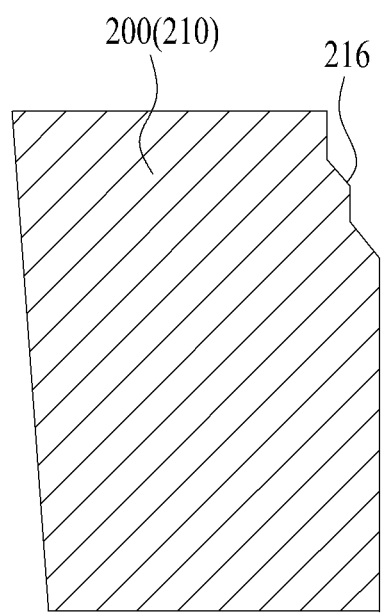
FIG. 6D is cross-sectional view showing another example of a slant step portion applicable to FIG. 3.

Further, as shown in FIG. 5, a portion of the heating part 600, which is close to the rotational axis A, is a slant heating portion 630 inclined toward the slant refracting surface 520.

As a result, the light which is incident from the heating part 600 is more steeply bent and irradiated onto the center of the substrate W, thereby enabling the center of the substrate W to be more effectively heated.

In this case, it is preferable that a slant angle β (See FIG. 5) with respect to the horizontal plane of the slant heating portion 630 is desirably in the range of 2 to 15 degrees.

However, of course, a certain degree of effect is achieved even if the angle of the slant heating portion 630 with respect to a horizontal surface is somewhat outside the above range.

Further, as shown in FIGS. 3 and 6A to 6D, the spin chuck 210 has slant surfaces 215 or slant step portions 216 inclined outward in a radial direction with respect to the vertical line from top of the inner peripheral surface thereof, and when viewed on a front section, the spin chuck 210 does not have any interference with a reference line connecting the periphery of the substrate W and the outermost position of the heating part 600, so that the radiation heat irradiated from the heating part 600 is completely transferred to the periphery of the substrate W, without having any interference with top of the inner peripheral surface of the spin chuck 210.

In this case, it is preferable that the surface connecting the start edge and end edge of each slant surface 215 or slant step portion 216 is the same as the reference line or slant more outward than the reference line.

However, the angle of the surface connecting the start edge and end edge of each slant surface 215 or slant step portion 216 with respect to the rotational axis A does not need to be limited specially.

As shown in FIG. 4, the slant surfaces 215 are intermittently formed in the circumferential direction of the chuck base 200 to avoid the interference with the chuck pins 250 and support pins 260.

As described above, the substrate treatment apparatus having the heating part according to the present disclosure is configured to have the chuck base disposed rotatable around the rotational axis and having the ring-shaped spin chuck with the chuck pins disposed on top thereof to support the substrate and the chuck support part located on the lower portion of the inner peripheral surface of the spin chuck, the back nozzle assembly mounted through the hollow portion formed at the center of the chuck base to spray the treatment liquid onto the underside of the substrate, the cover glass disposed between top of the spin chuck and the back nozzle assembly, when viewed in plan view, and having the through hole formed at the center thereof to pass the back nozzle assembly therethrough, and the heating part disposed inside the inner peripheral surface of the spin chuck in a space between the cover glass and the chuck support part, wherein when viewed in plan view, the cover glass has the slant refracting surface formed with a given width around the through hole, and when viewed on a front section, the slant refracting surface is slant upward from top of the cover glass in a radial direction with respect to the rotational axis, so that light, which is incident onto the cover glass from the heating part having LEDs is refracted on the slant refracting surface and thus irradiated onto the center of the substrate, without having any interference with the back nozzle assembly located at the center of the chuck base, thereby allowing the radiation heat generated from the heating part to be transferred uniformly to the entire region of the substrate.

According to the present disclosure, further, the substrate treatment apparatus having the heating part is configured to allow the thickness of the cover glass on the outside of the slant refracting surface along the radial direction is formed to be bigger than the thickness thereof on the inside, so that to do this, the neighboring region around the through hole of the flat cover glass is simply machined to be slant.

According to the present disclosure, moreover, the substrate treatment apparatus having the heating part is configured to allow the vertical lines passing through the innermost portion of the heating part to pass through the slant refracting surface, so that the light irradiated from the innermost portion of the heating part is appropriately refracted over the back nozzle assembly, thereby allowing the radiation heat generated from the heating part to be transferred to the central portion of the substrate efficiently.

According to the present disclosure, also, the substrate treatment apparatus having the heating part is configured to allow a portion of the heating part, which is close to the rotational axis, to be a slant heating portion inclined toward the slant refracting surface, so that the light incident from the heating part is more steeply bent and irradiated onto the center of the substrate, thereby enabling the center of the substrate to be more effectively heated.

According to the present disclosure, further, the substrate treatment apparatus having the heating part is configured to allow the spin chuck to have the slant surfaces or slant step portions inclined outward in a radial direction with respect to the vertical line from top of the inner peripheral surface thereof, while having no interference with a reference line connecting the periphery of the substrate and the outermost position of the heating part, when viewed on a front section, so that the radiation heat irradiated from the heating part is completely transferred to the periphery of the substrate, without having any interference with top of the inner peripheral surface of the spin chuck.

According to the present disclosure, additionally, the substrate treatment apparatus having the heating part is configured to allow at least a portion of the back nozzle assembly, which is located inside the slant refracting surface, to be made of a transparent or semi-transparent material, so that the light transmits the cover glass toward the center of the substrate, without being blocked by the back nozzle assembly, thereby allowing the entire region of the substrate to be uniformly heated.

The present disclosure may be modified in various ways and may have several exemplary embodiments. It is therefore intended that the scope of the disclosure be limited not by this detailed description, but rather by the claims appended hereto, and it should be understood that the disclosure covers all the modifications, equivalents, and replacements within the idea and technical scope of the disclosure.

What is claimed is:

1. A substrate treatment apparatus having a heating part, comprising:
   a chuck base disposed rotatable around a rotational axis and having a ring-shaped spin chuck with chuck pins disposed on top thereof to support a substrate and a chuck support part located on lower portion of the inner peripheral surface of the spin chuck;
   a back nozzle assembly mounted through a hollow portion formed at a center of the chuck base to spray treatment liquid onto the underside of the substrate;
   cover glass disposed between top of the spin chuck and the back nozzle assembly, when viewed from above the substrate along the rotational axis, and having a through hole formed at the center thereof to pass the back nozzle assembly therethrough; and
   the heating part disposed inside the inner peripheral surface of the spin chuck in a space between the cover glass and the chuck support part,
   wherein when viewed from above the substrate along the rotational axis, the cover glass has a slant refracting surface formed with a given width around the through hole, and when the cover glass is viewed from a surface cut in a radial direction with respect to the rotational axis, the slant refracting surface is slant upward from top of the cover glass in a radial direction with respect to the rotational axis.

2. The substrate treatment apparatus according to claim 1, wherein an imaginary straight lines extending from the innermost portion of the heating part along the rotational axis is in contact with the slant refracting surface.

3. The substrate treatment apparatus according to claim 2, wherein the slant refracting surface is slant in the range of 2 to 10 degrees with respect to a horizonal plane.

4. The substrate treatment apparatus according to claim 1, wherein a central portion of the heating part is a slant heating portion inclined toward the slant refracting surface.

5. The substrate treatment apparatus according to claim 4, wherein the slant heating portion has a slant angle in the range of 2 to 15 degrees with respect to the horizontal plane.

6. The substrate treatment apparatus according to claim 1, wherein the spin chuck has slant surfaces or slant step portions inclined outward in a radial direction with respect to the rotational axis on top of the inner peripheral surface thereof, and when the chuck base is viewed from a surface cut in a radial direction with respect to the rotational axis, the spin chuck has no interference with an imaginary straight line connecting the periphery of the substrate and the outermost position of the heating part.

7. The substrate treatment apparatus according to claim 1, wherein at least a portion of the back nozzle assembly, which is located inside the slant refracting surface, is made of a transparent or semi-transparent material.

8. The substrate treatment apparatus according to claim 7, wherein the back nozzle assembly comprises a back nozzle support shaft, a nozzle body supported on the back nozzle support shaft, a nozzle skirt disposed on top of the nozzle body with a cover glass in between, and a back nozzle passing through the back nozzle support shaft, the nozzle body; and the nozzle skirt along the rotational axis, and the nozzle skirt, the nozzle body, and the back nozzle are made of the transparent or semi-transparent material.

9. The substrate treatment apparatus according to claim 7, wherein the transparent or semi-transparent material of the back nozzle assembly is selected from quartz, sapphire, perfluoroalkoxy (PFA), and polychlorotrifluoroethylene (PCTFE).

* * * * *